United States Patent
Wu et al.

(10) Patent No.: US 10,923,631 B2
(45) Date of Patent: Feb. 16, 2021

(54) MICRO LIGHT EMITTING DEVICE AND DISPLAY APPARATUS

(71) Applicant: PlayNitride Inc., Hsinchu County (TW)

(72) Inventors: Chih-Ling Wu, Hsinchu County (TW); Yi-Min Su, Hsinchu County (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/779,682

(22) Filed: Feb. 3, 2020

(65) Prior Publication Data

US 2020/0176637 A1   Jun. 4, 2020

Related U.S. Application Data

(63) Continuation-in-part of application No. 15/869,097, filed on Jan. 12, 2018, now Pat. No. 10,593,834.

(30) Foreign Application Priority Data

Oct. 13, 2017  (TW) .................................. 106135076
Dec. 30, 2019  (TW) .................................. 108148260

(51) Int. Cl.
  *H01L 33/38*  (2010.01)
  *G09G 3/32*   (2016.01)
  *H01L 25/075* (2006.01)
  *H01L 33/62*  (2010.01)

(52) U.S. Cl.
  CPC ............. *H01L 33/382* (2013.01); *G09G 3/32* (2013.01); *H01L 25/0753* (2013.01); *H01L 33/62* (2013.01)

(58) Field of Classification Search
  None
  See application file for complete search history.

(56) References Cited

U.S. PATENT DOCUMENTS

| 5,780,321 | A | * | 7/1998 | Shieh | .................... H01L 25/162 438/34 |
| 5,994,766 | A | * | 11/1999 | Shenoy | ............... H01L 23/5225 257/659 |
| 2010/0109022 | A1 | * | 5/2010 | Kim | ........................ H01L 33/56 257/84 |

FOREIGN PATENT DOCUMENTS

TW           201507212         2/2015

OTHER PUBLICATIONS

"Office Action of Taiwan Counterpart Application", dated Apr. 30, 2020, p. 1-p. 7.

* cited by examiner

*Primary Examiner* — Anthony Ho
*Assistant Examiner* — Kevin Quinto
(74) *Attorney, Agent, or Firm* — JCIPRNET

(57) ABSTRACT

A micro light emitting device includes an epitaxial structure and a first type electrode. The epitaxial structure includes a first type semiconductor layer, a light emitting layer and a second type semiconductor layer. The light emitting layer is disposed between the first type semiconductor layer and the second type semiconductor layer. The first type semiconductor layer has a first accommodating cavity. The first type electrode is disposed on the first accommodating cavity. A maximum width of the first type electrode is greater than or equal to a maximum width of an upper surface of the first type semiconductor layer.

17 Claims, 11 Drawing Sheets

MICRO LIGHT EMITTING DEVICE AND DISPLAY APPARATUS

CROSS-REFERENCE TO RELATED APPLICATION

This application is a continuation-in-part application of and claims the priority benefit of U.S. application Ser. No. 15/869,097, filed on Jan. 12, 2018, now allowed, which claims the priority benefit of Taiwan application Ser. No. 106135076, filed on Oct. 13, 2017. This application also claims the priority benefit of Taiwan application Ser. No. 108148260, filed on Dec. 30, 2019. The entirety of each of the above-mentioned patent applications is hereby incorporated by reference herein and made a part of this specification.

BACKGROUND

Technical Field

The disclosure relates to a semiconductor device and an electronic apparatus, and particularly relates to a micro light emitting device and a display apparatus having the micro light emitting device.

Description of Related Art

Generally speaking, a light emitting diode chip may be electrically connected to an external circuit by wire bonding or flip-chip bonding. In the case of flip-chip bonding, an electrode of the light emitting diode chip may be electrically connected to a pad on the external circuit by a conductive material such as a conductive bump, a conductive paste, a solder, and so on. However, since a contact area between the foregoing conductive material and the light emitting diode chip is smaller than an area of the light emitting diode chip, there is not enough alignment margin between the foregoing conductive material and the external circuit. Consequently, the alignment accuracy between the light emitting diode chip and the external circuit is reduced.

SUMMARY

The disclosure provides a micro light emitting device that includes a first type electrode having an accommodating cavity and has a greater alignment margin.

The disclosure provides a display apparatus, in which the alignment accuracy between the micro light emitting device and a bonding pad disposed on a driving substrate is enhanced.

A micro light emitting device of the disclosure includes an epitaxial structure, a first type electrode, and a second type electrode. The epitaxial structure has a first accommodating cavity. The first type electrode is disposed on the first accommodating cavity of the epitaxial structure and has a second accommodating cavity. The second type electrode is disposed on the epitaxial structure, wherein the epitaxial structure is located between the first type electrode and the second type electrode.

In an embodiment of the disclosure, the epitaxial structure includes a first type semiconductor layer, a light emitting layer, and a second type semiconductor layer. The light emitting layer is disposed between the first type semiconductor layer and the second type semiconductor layer, and a width of the first type semiconductor layer is greater than or equal to a width of the second type semiconductor layer, wherein the first type semiconductor layer has the first accommodating cavity.

In an embodiment of the disclosure, the first type electrode is an n-type electrode, and the second type electrode is a p-type electrode.

In an embodiment of the disclosure, a melting point of the first type electrode is in a range of 100° C. to 300° C.

In an embodiment of the disclosure, the first accommodating cavity has a first depth, and a ratio of the first depth to a maximum height of the epitaxial structure is greater than 0 and less than or equal to 0.5.

In an embodiment of the disclosure, the second accommodating cavity has a first width, and a ratio of the first width to a maximum width of the epitaxial structure is greater than or equal to 0.6 and less than 1.

In an embodiment of the disclosure, the micro light emitting device further includes an insulating layer covering a first peripheral surface of the epitaxial structure.

In an embodiment of the disclosure, an edge of the insulating layer is aligned with a second peripheral surface of the first type electrode.

A display apparatus of the disclosure includes a driving substrate, a plurality of bonding pads, and a plurality of micro light emitting devices. The bonding pads are dispersedly disposed on the driving substrate. The micro light emitting devices are dispersedly disposed on the driving substrate and correspond to the plurality of bonding pads respectively. Each of the plurality of micro light emitting devices includes an epitaxial structure, a first type electrode, and a second type electrode. The epitaxial structure has a first accommodating cavity, wherein the first accommodating cavity and the driving substrate define a space. The first type electrode is disposed on the first accommodating cavity of the epitaxial structure and located in the space. The first type electrode is electrically connected to a corresponding bonding pad among the plurality of bonding pads. The second type electrode is disposed on the epitaxial structure, wherein the epitaxial structure is located between the first type electrode and the second type electrode.

In an embodiment of the disclosure, the epitaxial structure includes a first type semiconductor layer, a light emitting layer, and a second type semiconductor layer. The light emitting layer is disposed between the first type semiconductor layer and the second type semiconductor layer, and a width of the first type semiconductor layer is greater than or equal to a width of the second type semiconductor layer, wherein the first type semiconductor layer has the first accommodating cavity.

In an embodiment of the disclosure, the first type electrode is an n-type electrode, and the second type electrode is a p-type electrode.

In an embodiment of the disclosure, a melting point of the first type electrode is in a range of 100° C. to 300° C.

In an embodiment of the disclosure, the first accommodating cavity has a first depth, and a ratio of the first depth to a maximum height of the epitaxial structure is greater than 0 and less than or equal to 0.5.

In an embodiment of the disclosure, the display apparatus further includes an insulating layer covering a first peripheral surface of the epitaxial structure.

In an embodiment of the disclosure, an edge of the insulating layer is aligned with a second peripheral surface of the first type electrode.

In an embodiment of the disclosure, a melting point of each of the plurality of bonding pads is greater or equal to a melting point of the first type electrode.

In an embodiment of the disclosure, an orthogonal projection area of the first type electrode of each of the plurality of micro light emitting devices on the driving substrate is greater than an orthogonal projection area of the corresponding bonding pad on the driving substrate.

In an embodiment of the disclosure, a ratio of the orthogonal projection area of the first type electrode of each of the plurality of micro light emitting devices on the driving substrate to the orthogonal projection area of the corresponding bonding pad on the driving substrate is greater than 1 and less than or equal to 10.

In an embodiment of the disclosure, an air gap exists between the first type electrode of each of the plurality of micro light emitting devices and the driving substrate.

In an embodiment of the disclosure, the first type electrode of each of the plurality of micro light emitting devices directly contacts the driving substrate.

A micro light emitting device of the disclosure includes an epitaxial structure and a first type electrode. The epitaxial structure includes a first type semiconductor layer, a light emitting layer and a second type semiconductor layer. The light emitting layer is disposed between the first type semiconductor layer and the second type semiconductor layer. The first type semiconductor layer has a first accommodating cavity. The first type electrode is disposed on the first accommodating cavity. A maximum width of the first type electrode is greater than or equal to a maximum width of an upper surface of the first type semiconductor layer.

In an embodiment of the disclosure, the maximum width of the first type electrode is greater than or equal to a maximum width of the epitaxial structure.

In an embodiment of the disclosure, a width of the first type semiconductor layer is greater than or equal to a width of the second type semiconductor layer.

In an embodiment of the disclosure, the maximum width of the first type electrode is smaller than a maximum width of the epitaxial structure.

In an embodiment of the disclosure, a width of the first type semiconductor layer is smaller than or equal to a width of the second type semiconductor layer.

In an embodiment of the disclosure, the first accommodating cavity has a first depth, and a ratio of the first depth to a maximum height of the epitaxial structure is greater than 0 and less than or equal to 0.5.

In an embodiment of the disclosure, the first type electrode is disposed on a portion of a peripheral surface of the first type semiconductor layer.

In an embodiment of the disclosure, the first type electrode has a second accommodating cavity, and the second accommodating cavity has a first width, and a ratio of the first width to a maximum width of the epitaxial structure is greater than or equal to 0.6 and less than 1.

A display apparatus of the disclosure includes a driving substrate, a plurality of bonding pads, and a plurality of micro light emitting devices. The bonding pads are dispersedly disposed on the driving substrate. The micro light emitting devices are dispersedly disposed on the driving substrate and correspond to the plurality of bonding pads respectively. Each of the plurality of micro light emitting devices includes an epitaxial structure and a first type electrode. The epitaxial structure includes a first type semiconductor layer, a light emitting layer and a second type semiconductor layer. The light emitting layer is disposed between the first type semiconductor layer and the second type semiconductor layer. The first type semiconductor layer has a first accommodating cavity. The first accommodating cavity and the driving substrate define a space. The first type electrode is disposed on the first accommodating cavity of the first type semiconductor layer and located between the space and the first accommodating cavity. The first type electrode is electrically connected to a corresponding bonding pad among the plurality of bonding pads.

In an embodiment of the disclosure, the first accommodating cavity has a first depth, and a ratio of the first depth to a maximum height of the epitaxial structure is greater than 0 and less than or equal to 0.5.

In an embodiment of the disclosure, a maximum width of the first type electrode is greater than or equal to a maximum width of an upper surface of the first type semiconductor layer.

In an embodiment of the disclosure, the maximum width of the first type electrode is greater than or equal to a maximum width of the epitaxial structure.

In an embodiment of the disclosure, the maximum width of the first type electrode is smaller than a maximum width of the epitaxial structure.

In an embodiment of the disclosure, an orthogonal projection area of the first type electrode on the driving substrate is smaller than or equal to an orthogonal projection area of the corresponding bonding pad on the driving substrate.

In an embodiment of the disclosure, an orthogonal projection area of each of the plurality of micro light emitting devices on the driving substrate is smaller than or equal to an orthogonal projection area of the corresponding first type electrode on the driving substrate.

In an embodiment of the disclosure, the first type electrode of the each of the plurality of micro light emitting devices directly contacts the driving substrate.

In an embodiment of the disclosure, the first type electrode is disposed on a portion of a peripheral surface of the first type semiconductor layer.

In an embodiment of the disclosure, the display apparatus further includes a protective layer, wherein an air gap exists between the protective layer, the first type electrode, the plurality of bonding pads and the driving substrate.

In an embodiment of the disclosure, a distance between the first type electrode and the adjacent first type electrode is smaller than a width of the first type electrode.

Based on the above, the epitaxial structure of the micro light emitting device of this disclosure has the first accommodating cavity, and the first type electrode is disposed on the first accommodating cavity of the epitaxial structure and has the second accommodating cavity. In this way, when the subsequent bonding process is performed on the first type electrode and the driving substrate, the micro light emitting device of this disclosure has a greater alignment margin thanks to the design of the accommodating cavities. In addition, in the display apparatus using the micro light emitting device of this disclosure, because of the design of the accommodating cavities, the alignment accuracy between the micro light emitting device and the bonding pad disposed on the driving substrate is enhanced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
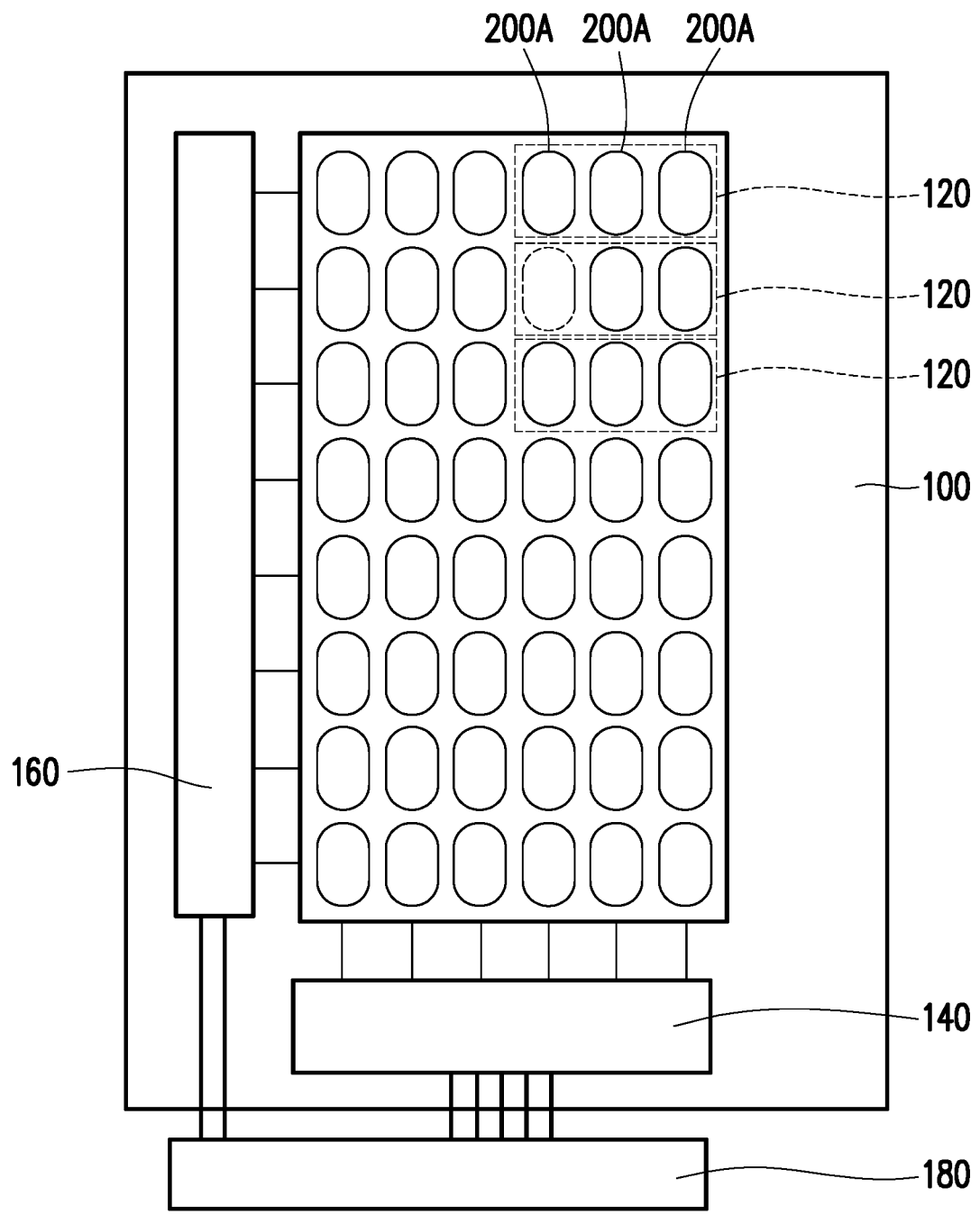
FIG. 1A is a top view of a display apparatus according to an embodiment of the disclosure.
Figure 1B:
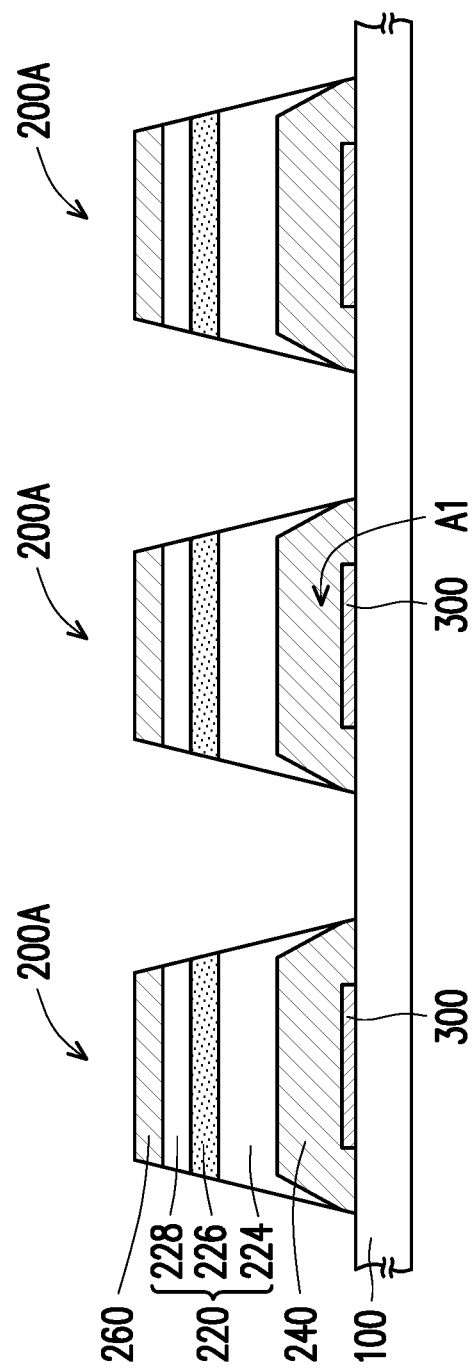
FIG. 1B is a schematic partial cross-sectional view of the display apparatus of FIG. 1A.
Figure 1C:
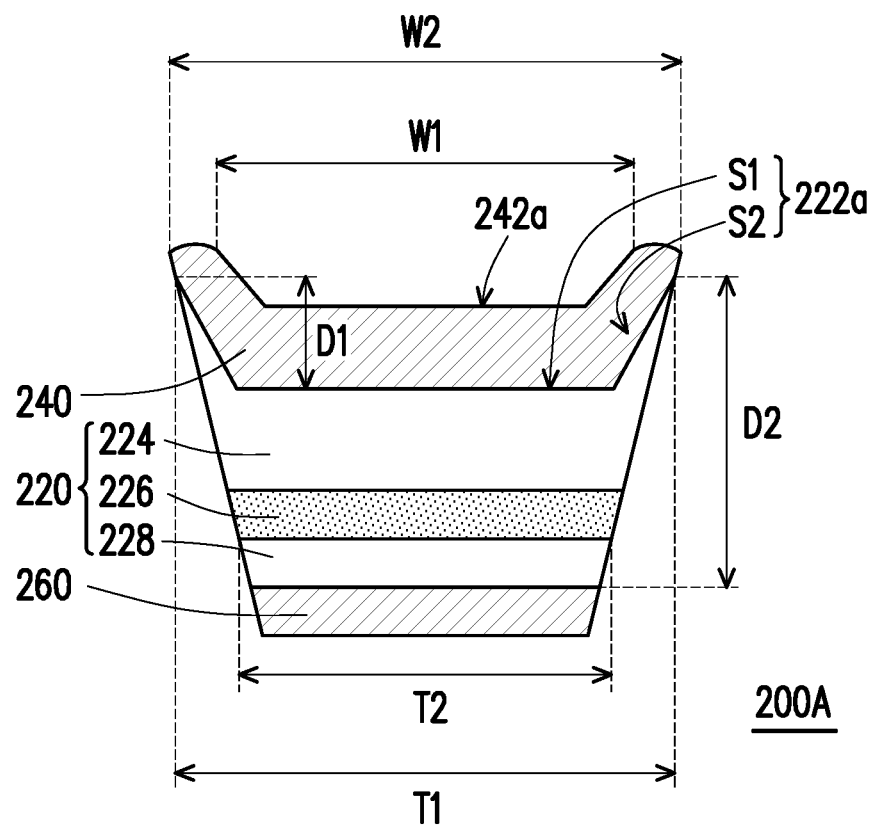
FIG. 1C is a schematic view of a micro light emitting device according to an embodiment of the disclosure.

FIG. 1A is a top view of a display apparatus according to an embodiment of the disclosure. FIG. 1B is a schematic partial cross-sectional view of the display apparatus of FIG. 1A. FIG. 1C is a schematic view of a micro light emitting device according to an embodiment of the disclosure. With reference to FIG. 1A, FIG. 1B and FIG. 1C simultaneously, in this embodiment, a display apparatus 10 includes a driving substrate 100, a plurality of micro light emitting devices 200A, and a plurality of bonding pads 300. The micro light emitting devices 200A and the bonding pads 300 are dispersedly disposed on the driving substrate 100 respectively, and the micro light emitting devices 200A correspond to the bonding pads 300 respectively. Each of the micro light emitting devices 200A includes an epitaxial structure 220, a first type electrode 240, and a second type electrode 260. The epitaxial structure 220 has a first accommodating cavity 222a. The first type electrode 240 is disposed on the first accommodating cavity 222a of the epitaxial structure 200 and has a second accommodating cavity 242a. The second type electrode 260 is disposed on the epitaxial structure 220, wherein the epitaxial structure 220 is located between the first type electrode 240 and the second type electrode 260. Herein, the display apparatus 10 may be a micro light emitting diode display apparatus, but the disclosure is not limited thereto. In addition, in the display apparatus 10 of this embodiment, only three micro light emitting devices 200A are illustrated as an example, but those skilled in the art, after referring to the disclosure, may change the number of the micro light emitting devices 200A according to actual requirements. The disclosure is not limited thereto.

In detail, with reference to FIG. 1A, in this embodiment, the driving substrate 100 has a plurality of pixel regions 120, the micro light emitting devices 200A are disposed on the driving substrate 100 separately from one another, and there are at least three micro light emitting devices 200A disposed in each pixel region 120, wherein the micro light emitting devices 200A may emit different light colors. More specifically, the display apparatus 10 of this embodiment is further provided with a scan line driving circuit 140, a data line driving circuit 160, and a control circuit 180, wherein the data line driving circuit 160 and the scan line driving circuit 140 are disposed on the driving substrate 100 and electrically connected to the driving substrate 100. The micro light emitting devices 200A is driven by the data line driving circuit 160 and the scan line driving circuit 140 to emit light, and the data line driving circuit 160 and the scan line driving circuit 140 are electrically connected to the control circuit 180 such that the light-emitting sequence and time of the micro light emitting devices 200A may be adjusted in accordance with the design of the control circuit 180. Herein, the driving substrate 100 of this embodiment is, for example, a complementary metal-oxide-semiconductor (CMOS) substrate, a liquid crystal on silicon (LCOS) substrate, a thin film transistor (TFT) substrate, or other kinds of substrate with a work circuit, and the disclosure is not limited thereto.

With reference to FIG. 1C again, the micro light emitting devices 200A of this embodiment are embodied as micro light emitting devices that have not yet been bonded onto the driving substrate 100. The epitaxial structure 220 of the micro light emitting device 200A includes a first type semiconductor layer 224, a light emitting layer 226, and a second type semiconductor layer 228. The light emitting layer 226 is disposed between the first type semiconductor layer 224 and the second type semiconductor layer 228, wherein the first type semiconductor layer 224 has the first accommodating cavity 222a. More specifically, the first accommodating cavity 222a is formed by a portion of the first type semiconductor layer 224. A width T1 of the first type semiconductor layer 224 is greater than a width T2 of the second type semiconductor layer 228. In other words, in this embodiment, the width of the epitaxial structure 220 of the micro light emitting device 200A is decreased along the direction from the first type semiconductor layer 224 to the second type semiconductor layer 228, so that a cross-sectional shape of the epitaxial structure 220 in the vertical direction is a trapezoid. It should be additionally noted that a maximum width difference between the first type semiconductor layer 224 and the second type semiconductor layer 228 in the epitaxial structure 220 of the micro light emitting device 200A may be adjusted in a range of 0 µm to 5 µm according to actual requirements of product application. That is to say, in other embodiments not shown here, the width of the first type semiconductor layer may also be equal to the width of the second type semiconductor layer, and the disclosure is not limited thereto. In addition, in this embodiment, a maximum height of the first type semiconductor layer 224 on the vertical cross-section may be greater than a maximum height of the second type semiconductor layer 228 on the vertical cross-section. Specifically, the height of the first type semiconductor layer 224 on the vertical cross-section may be in a range of 1 µm to 5 µm, the height of the light emitting layer 226 on the vertical cross-section may be in a range of 0.1 µm to 1 µm, and the height of the second type semiconductor layer 228 on the vertical cross-section may be in a range of 0.1 µm to 0.5 µm, so that an overall height of the epitaxial structure 220 may be controlled to be in a range of 1 µm to 6 µm to ensure the yield of subsequent processes and the properties of end products.

In this embodiment, the first type electrode 240 and the second type electrode 260 of the micro light emitting device 200A are located on opposite two sides of the epitaxial structure 220 respectively. Herein, the first type electrode 240 is electrically connected to the first type semiconductor layer 224 of the epitaxial structure 220, and the second type electrode 260 is electrically connected to the second type semiconductor layer 228 of the epitaxial structure 220. In other words, the micro light emitting device 200A is embodied as a vertical type micro LED, and a maximum width of the micro light emitting device 200A may be in a range of 1 µm to 150 µm and preferably in a range of 1 µm to 50 µm. Herein, the first type electrode 240 is embodied as an n-type electrode, and the second type electrode 260 is embodied as a p-type electrode, but the disclosure is not limited thereto. Herein, a material of the first type electrode 240 may be a metal with a low melting point such as indium (In), tin (Sn), alloys of the foregoing metals, or a combination of the foregoing alloys to facilitate the operation in subsequent processes and the yield of the display apparatus 10. Herein, a melting point of the first type electrode 240 may be in a range of 100° C. to 300° C., but the disclosure is not limited thereto. A material of the second type electrode 260 includes a semi-transparent conductive material or a transparent conductive material such as indium tin oxide (ITO) having a high work function in a range of 4.5 eV to 5.3 eV and having stable quality and high light transmittance, so that the light generated by the light emitting layer 226 is emitted via the second type electrode 260. In addition, a maximum peak current density of an external quantum efficiency curve of the micro light emitting device 200A is preferably in a range of 0.01 $A/cm^2$ to 2 $A/cm^2$. That is to say, the micro light emitting device 200A of this embodiment is adapted to operate at low current density.

Furthermore, as shown in FIG. 1C, the first type electrode 240 conformally covers the first type semiconductor layer 224 such that the first type electrode 240 has the second accommodating cavity 242a. Specifically, the first type electrode 240 completely covers the first accommodating cavity 222a of the epitaxial structure 220, and a cross-sectional shape of the second accommodating cavity 242a is approximately the same as a cross-sectional shape of the first accommodating cavity 222a. Herein, a thickness of a bottom surface S1 of the first type electrode 240 on the first accommodating cavity 222a is greater than a thickness of a side surface S2 of the first type electrode 240 on the first accommodating cavity 222a, so that the more fragile side of the first accommodating cavity 222a of the first type semiconductor layer 224 is prevented from being damaged. Surely, in other embodiments not shown here, the first type electrode may also cover the bottom surface and the side surface of the first accommodating cavity with the same thickness, and such configuration still falls within the protective scope of the disclosure. Preferably, in this embodiment, the first accommodating cavity 222a has a first depth D1, the epitaxial structure 220 has a maximum height D2, and a ratio of the first depth D1 to the maximum height D2 is greater than 0 and less than or equal to 0.5, so that the micro light emitting device 200A has a higher structural yield. If the ratio is greater than 0.5, the structural yield of the micro light emitting device 200A itself may be affected due to the fact that the depth of the first accommodating cavity 222a is too deep. In addition, the second accommodating cavity 224a has a first width W1, the epitaxial structure 220 has a maximum width W2, and a ratio of the first width W1 to the maximum width W2 is greater than or equal to 0.6 and less than 1, so that the second accommodating cavity 242a of the first type electrode 240 has a certain aperture ratio. Consequently, the micro light emitting device 200A may have a greater alignment margin in subsequent processes. If the width ratio is less than 0.6, the process margin of the subsequent bonding process may be affected.

With reference to FIG. 1A and FIG. 1B again, in this embodiment, the bonding pads 300 correspond to the micro light emitting devices 200A and are disposed on the driving substrate 100 as an array, for example. An orthogonal projection area of the first type electrode 240 of the micro light emitting device 200A on the driving substrate 100 is greater than an orthogonal projection area of the corresponding bonding pad 300 on the driving substrate 100. More specifically, a ratio of the orthogonal projection area of the first type electrode 240 of the micro light emitting device 200A on the driving substrate 100 to the orthogonal projection area of the corresponding bonding pad 300 on the driving substrate 100 is greater than 1 and less than or equal to 10. In other words, the ratio of the orthogonal projection area of the first type electrode 240 of the micro light emitting device 200A on the driving substrate 100 to the orthogonal projection area of the bonding pad 300 on the driving substrate 100 changes according to the size of the micro light emitting device 200A and actual design requirements. For example, when the size of the micro light emitting device 200A is greater than 50 µm, due to the larger size of the micro light emitting device 200A, the ratio of the orthogonal projection area of the first type electrode 240 of each micro light emitting device 200A to the orthogonal projection area of the corresponding bonding pad 300 on the driving substrate 100 is greater than 3 and less than or equal to 10, thereby resulting in a greater fabrication tolerance in alignment bonding. In addition, when the size of the micro light emitting device 200A is less than or equal to 50 µm, due to the smaller size of the micro light emitting device 200A, the ratio of the orthogonal projection area of the first type electrode 240 of each micro light emitting device 200A to the orthogonal projection area of the corresponding bonding pad 300 on the driving substrate 100 is greater than 1 and less than or equal to 5, thereby resulting in a higher process yield in alignment bonding. Here, a material of the bonding pad 300 includes gold (Au), titanium (Ti), platinum (Pt), aluminum (Al), nickel (Ni), chromium (Cr), indium (In), tin (Sn), or alloys of the forgoing metals. It should be noted that a melting point of the bonding pad 300 may be greater or equal to the melting point of the first type electrode 240, thereby the first type electrode 240 with a low melting point exhibits a molten state so as to be electrically connected to the corresponding bonding pad 300 and be bonded onto the driving substrate 100 to achieve a higher process yield in alignment bonding. Here, a metal or an alloy having a melting point similar to that of the first type electrode 240 is selected for the bonding pad 300, such as using indium for both components, but the disclosure is not limited thereto. Up to this step, the overall configuration of the display apparatus 10 of this embodiment is generally completed.

In terms of assembly, please refer to FIG. 1B and FIG. 1C simultaneously. First, the second accommodating cavity 242a of the first type electrode 240 of the micro light emitting device 200A is directed toward the driving substrate 100 provided with the bonding pads 300. Then, the micro light emitting device 200A is placed on the driving substrate 100 by a bonding process. As a result, the first type electrode 240 of the micro light emitting device 200A directly contacts and is electrically connected to the driving substrate 100, and the corresponding bonding pad 300 is located in a space Al defined by the second accommodating cavity 242a and the driving substrate 100. At this time, due to the temperature during the bonding process, the first type electrode 240 with a low melting point exhibits a molten state so as to be electrically connected to the corresponding bonding pad 300 and be bonded onto the driving substrate 100. At this time, the bonding pad 300 with a low melting point may also exhibit a partially molten state and be bonded to the molten first type electrode 240 through eutectic bonding. Since the first type electrode 240 has the second accommodating cavity 242*a*, the molten bonding pad 300 and the molten first type electrode 240 are mostly left in the space Al defined by the second accommodating cavity 242*a* and the driving substrate 100 without overflowing and widely spreading onto the driving substrate 100. Afterwards, a curing process is performed to cure the molten first type electrode 240 and the molten bonding pad 300, thereby completing the process of assembling the micro light emitting device 200A onto the driving substrate 100 so as to define the display apparatus 10.

Since the first type electrode 240 and the bonding pad 300 are both metals or alloys with a low melting point, when the micro light emitting device 200A is bonded to the driving substrate 100 by the bonding pad 300 to form the display apparatus 10, the operating temperature need not be set too high, thereby resulting in a higher yield. It is worth noting that the second accommodating cavity 242*a* of the first type electrode 240 in this embodiment is designed to have a guiding function, so that the micro light emitting device 200A, when coming into contact with an edge of the corresponding bonding pad 300, may accommodate the corresponding bonding pad 300 in the second accommodating cavity 242*a*. Consequently, the micro light emitting device 200A has a greater alignment margin, and the alignment accuracy between the micro light emitting device 200A and the driving substrate 100 is enhanced.

Figure 1D:
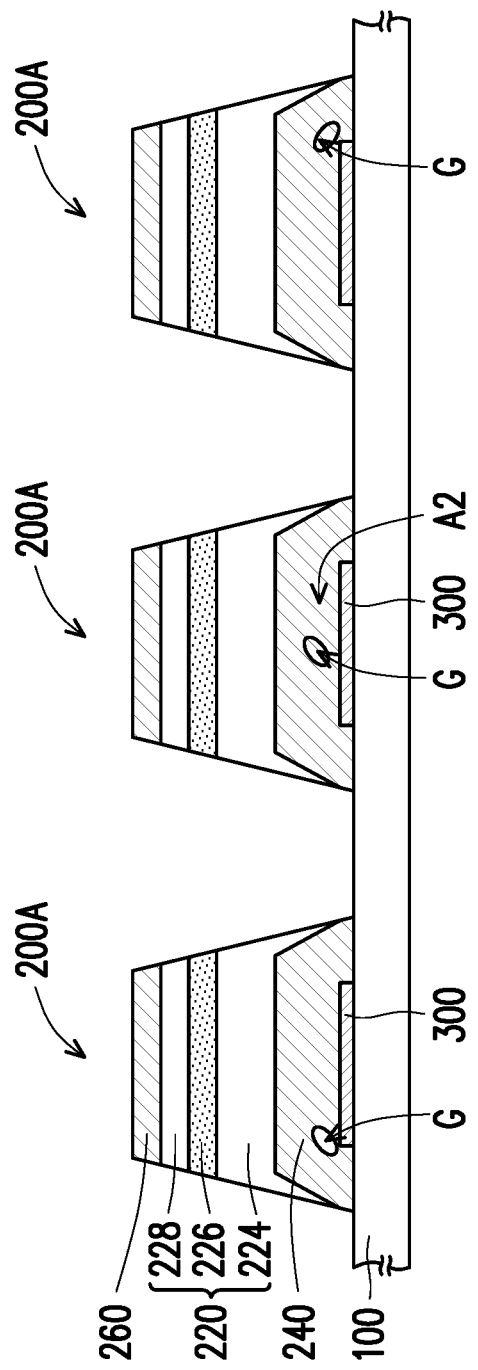
FIG. 1D is a schematic partial cross-sectional view of another kind of display apparatus according to an embodiment of the disclosure.

In addition, as shown in FIG. 1B, after the micro light emitting device 200A and the driving substrate 100 are bonded, the space Al defined by the micro light emitting device 200A and the driving substrate 100 is completely filled by the molten first type electrode 240 and the molten bonding pad 300. Consequently, no air gap appears in the space A1 when the subsequent curing process is performed. However, with reference to FIG. 1D, in a space A2 defined by the first type electrode 240 of the micro light emitting device 200A and the driving substrate 100, there may also be an air gap G to serve as a buffering space when bonding is performed. In other words, the air space G exists between the micro light emitting device 200A and the driving substrate 100. However, the air space G does not affect the electrical capacity of the display apparatus 10, and such configuration still falls within the protective scope of the disclosure.

It should be noted here that the reference numerals and part of the contents of the previous embodiment are used in the following embodiments, in which identical reference numerals indicate identical or similar components, and descriptions of the same technical contents are omitted. Please refer to the description of the previous embodiment for the omitted contents, which will not be repeated in the following embodiments.

Figure 2:
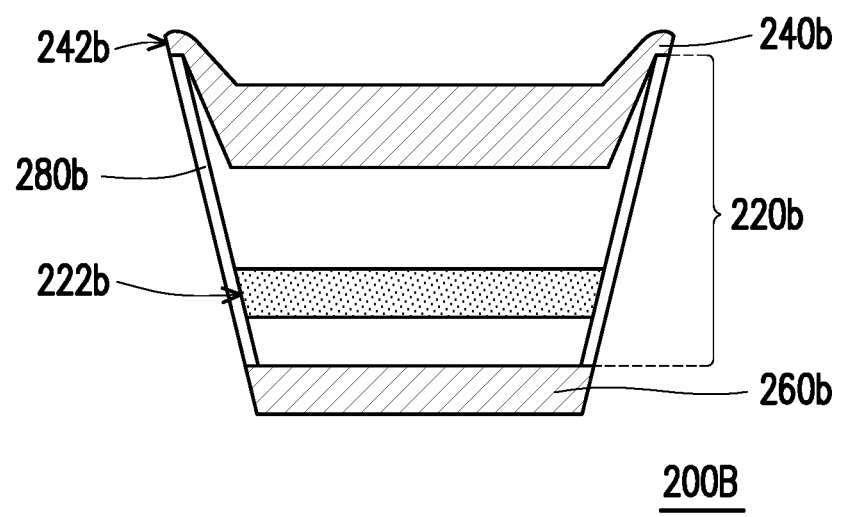
FIG. 2 is a schematic view of a micro light emitting device according to another embodiment of the disclosure.

FIG. 2 is a schematic view of a micro light emitting device according to another embodiment of the disclosure. With reference to FIG. 1C and FIG. 2 simultaneously, a micro light emitting device 200B of this embodiment is similar to the micro light emitting device 200A of FIG. 1C, and a difference between the two devices is that the micro light emitting device 200B of this embodiment further includes an insulating layer 280*b*. Herein the insulating layer 280*b* covers a first peripheral surface 222*b* of an epitaxial structure 220*b* to prevent the outside moisture or oxygen from invading the epitaxial structure 220*b*. Herein, the insulating layer 280*b* is disposed on the first peripheral surface 222*b* of the epitaxial structure 220*b* and located between a first type electrode 240*b* and a second type electrode 260*b*. Particularly, an edge of the insulating layer 280*b* is aligned with a second peripheral surface 242*b* of the first type electrode 240*b*, and the first type electrode 240*b* extends to be disposed on the insulating layer 280*b*, so that there is a greater bonding area between the first type electrode 240*b* and a bonding pad (not shown). Here, the edge of the insulating layer 280*b* is also aligned with a peripheral surface of the second type electrode 260*b* to provide a greater bonding area for a common electrode (not shown) in the subsequent process. However, in other embodiments not shown here, the second type electrode may also be retracted instead of being aligned with the edge of the insulating layer. The disclosure is not limited thereto.

Figure 3:
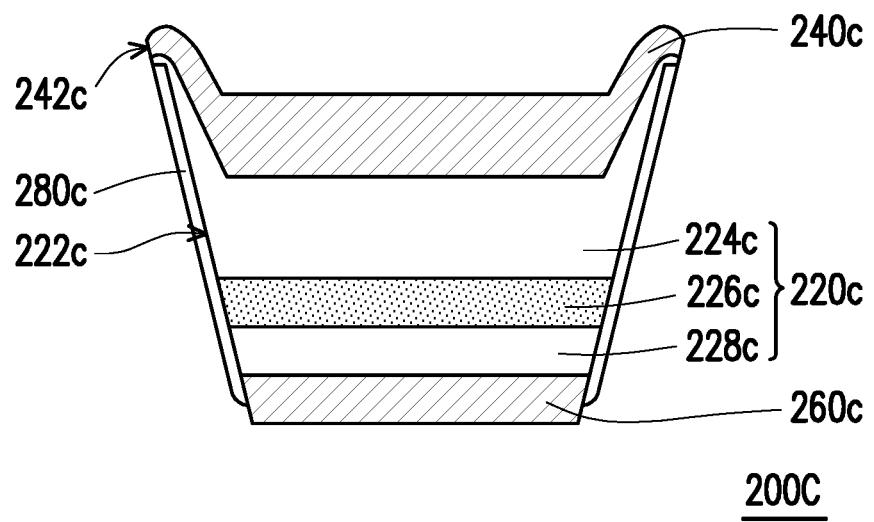
FIG. 3 is a schematic view of a micro light emitting device according to another embodiment of the disclosure.

FIG. 3 is a schematic view of a micro light emitting device according to another embodiment of the disclosure. With reference to FIG. 2 and FIG. 3 simultaneously, a micro light emitting device 200C of this embodiment is similar to the micro light emitting device 200B of FIG. 2, and a difference between the two devices is that an insulating layer 280*c* of this embodiment, in addition to covering a first peripheral surface 222*c* of an epitaxial structure 220*c*, further extends from a second type semiconductor layer 228*c* to cover a portion of a side surface of a second type electrode 260*c*, thereby further ensuring that the invasion of the outside moisture or oxygen does not damage the epitaxial structure 220*c*. In addition, due to process variation, in the micro light emitting device 200C, a portion of a first type semiconductor layer 224*c* of the epitaxial structure 220*c* may also extend to be sandwiched between a first type electrode 240*c* and the insulating layer 280*c*. As long as the insulating layer 280*c* provides sufficient protection against moisture or oxygen to a light emitting layer 226*c* of the epitaxial structure 220*c*, such configuration still falls within the protective scope of the disclosure. Herein, the first type semiconductor layer 224*c*, the insulating layer 280*c*, and a second peripheral surface 242*c* of the first type electrode 240*c* are approximately aligned with one another.

Figure 4A:
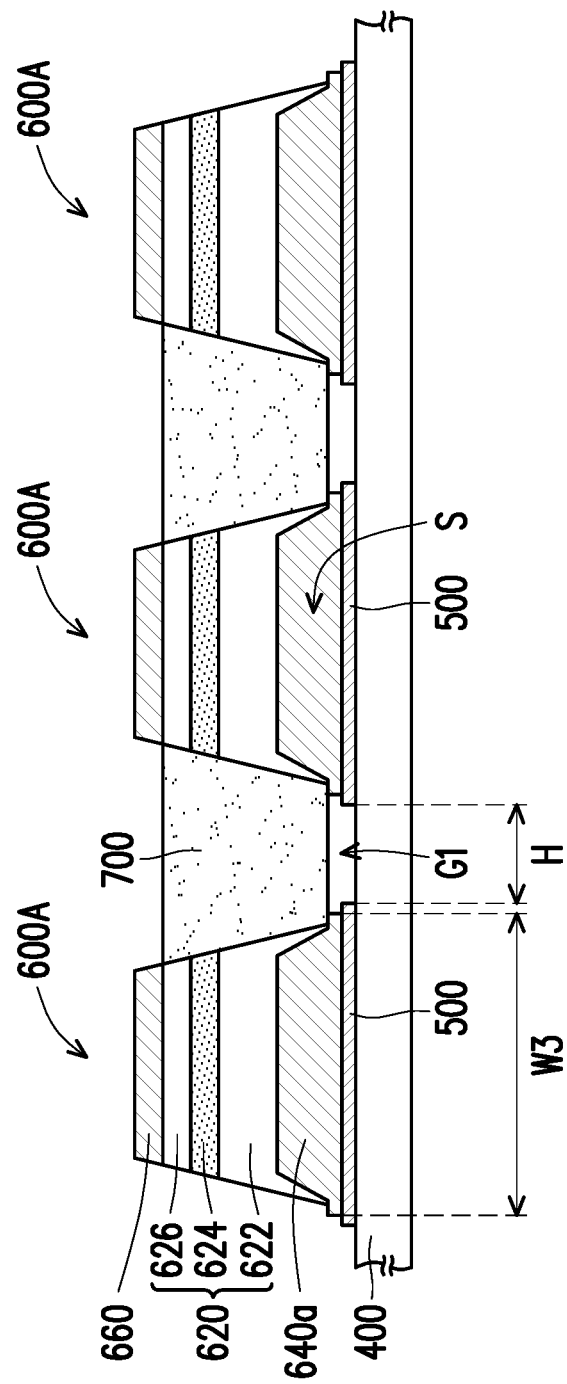
FIG. 4A is a schematic partial cross-sectional view of the display apparatus according to another embodiment of the disclosure.
Figure 4B:
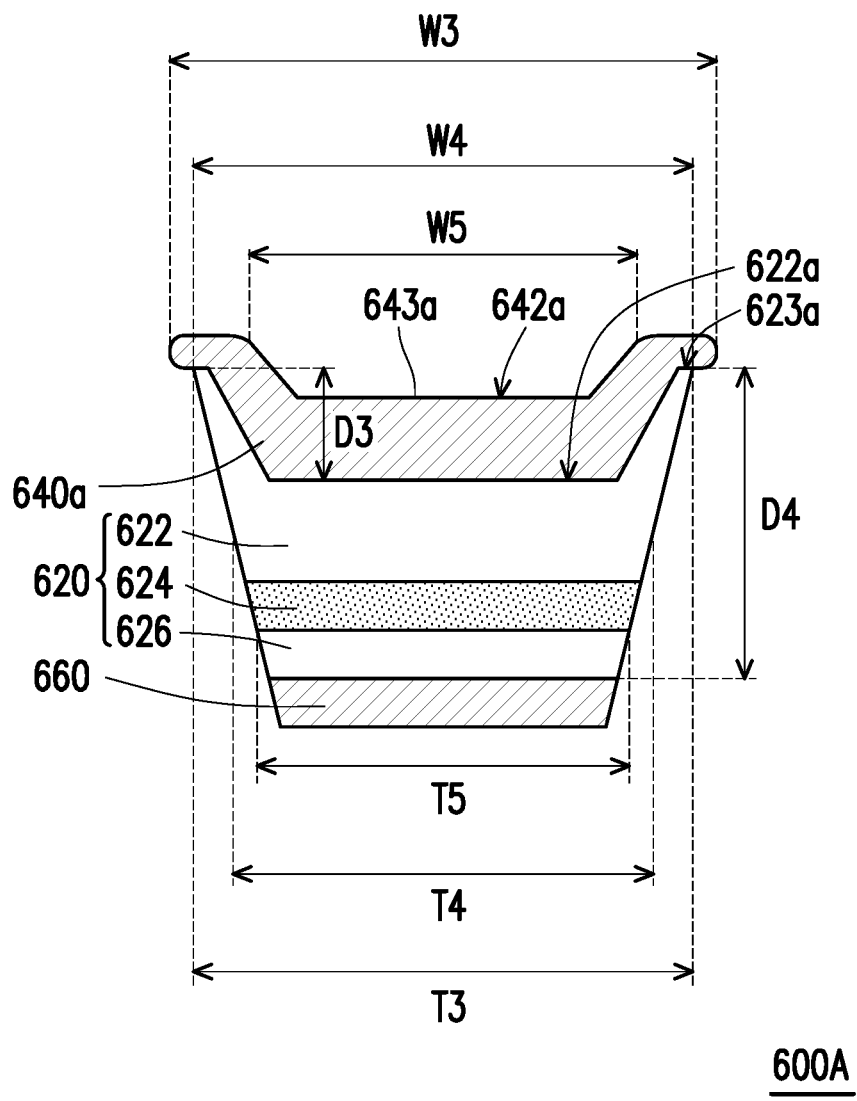
FIG. 4B is a schematic view of a micro light emitting device of the display apparatus of FIG. 4A.

FIG. 4A is a schematic partial cross-sectional view of the display apparatus according to another embodiment of the disclosure. FIG. 4B is a schematic view of a micro light emitting device of the display apparatus of FIG. 4A. With reference to FIG. 4A and FIG. 4B simultaneously, in this embodiment, a display apparatus 20 includes a driving substrate 400, a plurality of bonding pads 500, and a plurality of micro light emitting devices 600A. The bonding pads 500 are dispersedly disposed on the driving substrate 400. The micro light emitting devices 600A are dispersedly disposed on the driving substrate 400 and correspond to the plurality of bonding pads 500 respectively. Each of the plurality of micro light emitting devices 600A includes an epitaxial structure 620, a first type electrode 640*a* and a second electrode 660. The epitaxial structure 620 includes a first type semiconductor layer 622, a light emitting layer 624 and a second type semiconductor layer 626. The light emitting layer 624 is disposed between the first type semiconductor layer 622 and the second type semiconductor layer 626. The first type semiconductor layer 622 has a first accommodating cavity 622*a*. The first accommodating cavity 622*a* and the driving substrate 400 define a space S. The first type electrode 640*a* is disposed on the first accommodating cavity 622*a* of first type semiconductor layer 622, and located between the space S and the first accommodating cavity 622a. The first type electrode 640a is electrically connected to a corresponding bonding pad 500 among the plurality of bonding pads 500. The second type electrode 660 is disposed on the epitaxial structure 620, wherein the epitaxial structure 620 is located between the first type electrode 640a and the second type electrode 660.

In more detail, a maximum width W3 of the first type electrode 640a is greater than or equal to a maximum width W4 of an upper surface 623 of the first type semiconductor layer 622. Since an upper surface 643a of the first type electrode 640a which is as a bonding surface is greater than the upper surface 623a of the first type semiconductor layer 622, the subsequent bonding area can be increased. The first accommodating cavity 622a has a first depth D3, and a ratio of the first depth D3 to a maximum height D4 of the epitaxial structure 620 is greater than 0 and less than or equal to 0.5. The maximum width W3 of the first type electrode 640a is greater than or equal to a maximum width T3 of the epitaxial structure 620. A width T4 of the first type semiconductor layer 622 is greater than or equal to a width T5 of the second type semiconductor layer 626. An orthogonal projection area of the first type electrode 640a on the driving substrate 500 is, for example, smaller than or equal to an orthogonal projection area of the corresponding bonding pad 500 on the driving substrate 400. An orthogonal projection area of each of the plurality of micro light emitting devices 600A on the driving substrate 400 is, for example, smaller than or equal to an orthogonal projection area of the corresponding first type electrode 640a on the driving substrate 400. Specifically, the orthogonal projection area of each of the plurality of micro light emitting devices 600A on the driving substrate 400 is smaller than the orthogonal projection area of the corresponding first type electrode 640a on the driving substrate 400, and the orthogonal projection area of the first type electrode 640a on the driving substrate 400 is smaller than an orthogonal projection area of the corresponding bonding pad 500 on the driving substrate 400. Through the above design, during the bonding process, it can be avoided that the micro light emitting device 600A and the corresponding first type electrode 640a of the micro light emitting device 600A will interface with the adjacent light emitting device 600A and the corresponding first type electrode 640a of the micro light emitting device 600A and cause a short-circuit, and a better bonding yield can be obtained.

Furthermore, the display apparatus 20 further includes a protective layer 700, wherein an air gap G1 exists between the protective layer 700, the first type electrode 640a, the plurality of bonding pads 300 and the driving substrate 400. The air gap G1 can be used as a buffer space for overflow during bonding process, which can prevent short-circuit between the micro light emitting devices 600A or the bonding pads 500. A distance H between the first type electrode 640a and the adjacent first type electrode 640a is smaller than the maximum width W3 of the first type electrode 640a. Through this design, the display apparatus 20 can be better aligned in a high-density arrangement. In addition, the first type electrode 640a has a second accommodating cavity 642a, and the second accommodating cavity 642a has a first width W5, and a ratio of the first width W5 to the maximum width T3 of the epitaxial structure 620 is greater than or equal to 0.6 and less than 1. When the size of the micro light emitting device 600A is smaller than 10 μm, the display apparatus 20 can have a higher resolution.

Figure 5:
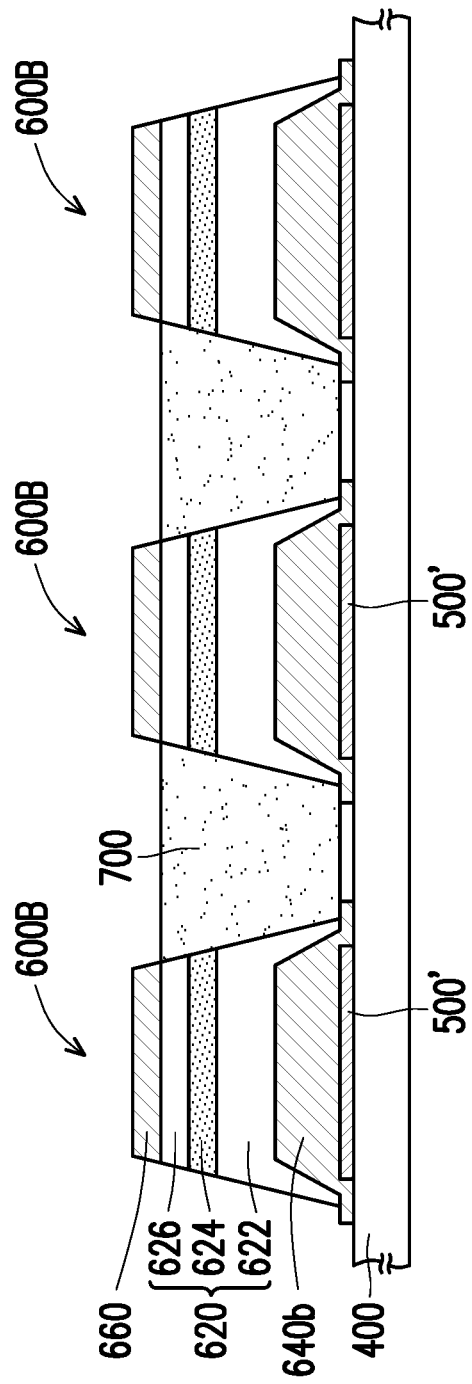
FIG. 5 is a schematic partial cross-sectional view of the display apparatus according to another embodiment of the disclosure.

FIG. 5 is a schematic partial cross-sectional view of the display apparatus according to another embodiment of the disclosure. With reference to FIG. 4A and FIG. 5 simultaneously, a micro light emitting device 600B of this embodiment is similar to the micro light emitting device 600A of FIG. 4A, and a difference between the two devices is that in the display apparatus 20' of the embodiment, the first type electrode 640b of the each of the plurality of micro light emitting devices 600B directly contacts the driving substrate 400. Namely, the size of the first type electrode 640b is greater than a size of the corresponding bonding pad 500', so that the area of the first type electrode 640b in contact with the corresponding bonding pad 500' is the largest. Furthermore, the corresponding bonding pad 500' can be prevented from overflowing in the cavity of the first type electrode 640b, which has better bonding effect and yield.

Figure 6:
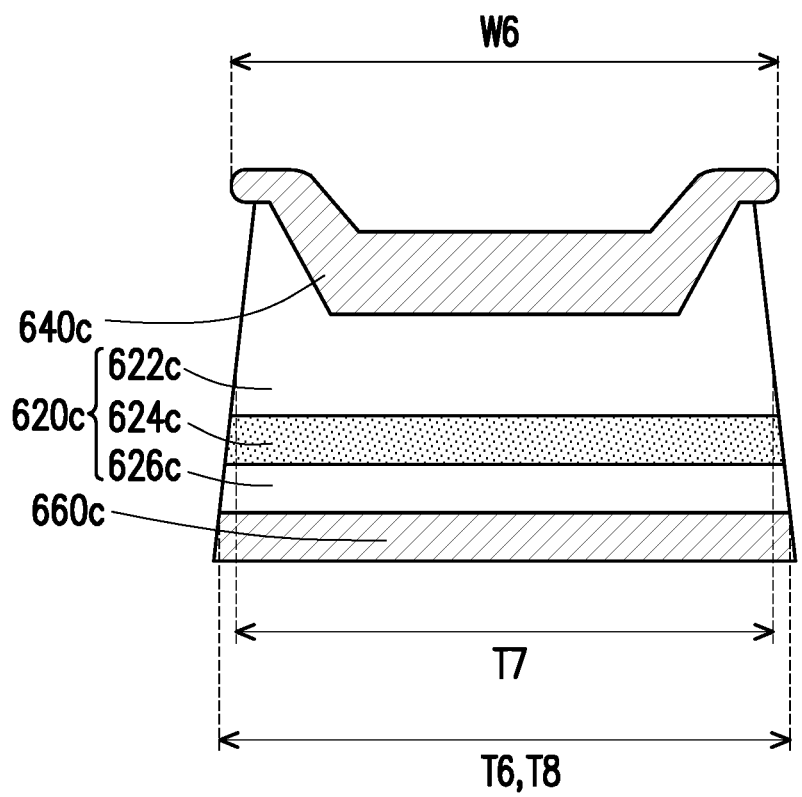
FIG. 6 is a schematic view of a micro light emitting device according to another embodiment of the disclosure.

FIG. 6 is a schematic view of a micro light emitting device according to another embodiment of the disclosure. With reference to FIG. 4B and FIG. 6 simultaneously, a micro light emitting device 600C of this embodiment is similar to the micro light emitting device 600A of FIG. 4A, and a difference between the two devices is that the maximum width W6 of the first type electrode 640c is smaller than a maximum width T6 of the epitaxial structure 620c. Therefore, the micro light emitting device 600C can have a large light emitting area. Herein, a width T7 of the first type semiconductor layer 622c is smaller than or equal to a width T8 of the second type semiconductor layer 626c.

Figure 7:
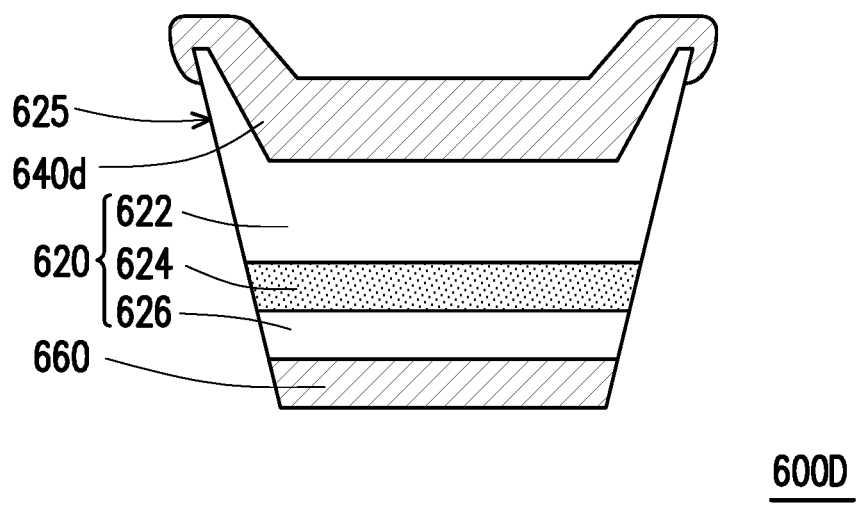
FIG. 7 is a schematic view of a micro light emitting device according to another embodiment of the disclosure.

FIG. 7 is a schematic view of a micro light emitting device according to another embodiment of the disclosure. With reference to FIG. 4B and FIG. 7 simultaneously, a micro light emitting device 600D of this embodiment is similar to the micro light emitting device 600A of FIG. 4A, and a difference between the two devices is that the first type electrode 640d is disposed on a portion of a peripheral surface 625 of the first type semiconductor layer 622. Therefore, the bonding area can be increased.

In summary, the epitaxial structure of the micro light emitting device of this disclosure has the first accommodating cavity, and the first type electrode is disposed on the first accommodating cavity of the epitaxial structure and has the second accommodating cavity. In this way, when the subsequent bonding process is performed on the first type electrode and the driving substrate, the micro light emitting device of this disclosure has a greater alignment margin thanks to the design of the accommodating cavities. In addition, in the display apparatus using the micro light emitting device of this disclosure, because of the design of the accommodating cavities of the micro light emitting device, the alignment accuracy between the micro light emitting device and the bonding pad disposed on the driving substrate is enhanced.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light emitting device, comprising:
an epitaxial structure comprising a first type semiconductor layer, a light emitting layer and a second type semiconductor layer, wherein the light emitting layer is disposed between the first type semiconductor layer and the second type semiconductor layer, and the first type semiconductor layer has a first accommodating cavity; and a first type electrode disposed on the first accommodating cavity, wherein a maximum width of the first type electrode is greater than or equal to a maximum width of an upper surface of the first type semiconductor layer,
wherein the first accommodating cavity has a first depth, and a ratio of the first depth to a maximum height of the epitaxial structure is greater than 0 and less than or equal to 0.5.

2. The micro light emitting device as recited in claim 1, wherein the first type electrode is disposed on a portion of a peripheral surface of the first type semiconductor layer.

3. The micro light emitting device as recited in claim 1, wherein the first type electrode has a second accommodating cavity, and the second accommodating cavity has a first width, and a ratio of the first width to a maximum width of the epitaxial structure is greater than or equal to 0.6 and less than 1.

4. The micro light emitting device as recited in claim 1, wherein the maximum width of the first type electrode is greater than or equal to a maximum width of the epitaxial structure.

5. The micro light emitting device as recited in claim 4, wherein a width of the first type semiconductor layer is greater than or equal to a width of the second type semiconductor layer.

6. The micro light emitting device as recited in claim 1, wherein the maximum width of the first type electrode is smaller than a maximum width of the epitaxial structure.

7. The micro light emitting device as recited in claim 6, wherein a width of the first type semiconductor layer is smaller than or equal to a width of the second type semiconductor layer.

8. A display apparatus, comprising:
a driving substrate;
a plurality of bonding pads dispersedly disposed on the driving substrate; and
a plurality of micro light emitting devices dispersedly disposed on the driving substrate and corresponding to the plurality of bonding pads respectively, wherein each of the plurality of micro light emitting devices comprises:
an epitaxial structure comprising a first type semiconductor layer, a light emitting layer and a second type semiconductor layer, wherein the light emitting layer is disposed between the first type semiconductor layer and the second type semiconductor layer, and the first type semiconductor layer has a first accommodating cavity, and the first accommodating cavity and the driving substrate define a space; and
a first type electrode disposed on the first accommodating cavity of the first type semiconductor layer and located between the space and the first accommodating cavity, wherein the first type electrode is electrically connected to a corresponding bonding pad among the plurality of bonding pads,
wherein the first accommodating cavity has a first depth, and a ratio of the first depth to a maximum height of the epitaxial structure is greater than 0 and less than or equal to 0.5.

9. The display apparatus as recited in claim 8, wherein the first type electrode of the each of the plurality of micro light emitting devices directly contacts the driving substrate.

10. The display apparatus as recited in claim 8, wherein the first type electrode is disposed on a portion of a peripheral surface of the first type semiconductor layer.

11. The display apparatus as recited in claim 8, further comprising:
a protective layer disposed on the driving substrate and between the plurality of micro light emitting devices, wherein an air gap exists between the protective layer, the first type electrode, the plurality of bonding pads and the driving substrate.

12. The display apparatus as recited in claim 8, wherein a distance between the first type electrode and the adjacent first type electrode is smaller than a width of the first type electrode.

13. The display apparatus as recited in claim 8, wherein a maximum width of the first type electrode is greater than or equal to a maximum width of an upper surface of the first type semiconductor layer.

14. The display apparatus as recited in claim 13, wherein the maximum width of the first type electrode is greater than or equal to a maximum width of the epitaxial structure.

15. The display apparatus as recited in claim 13, wherein the maximum width of the first type electrode is smaller than a maximum width of the epitaxial structure.

16. The display apparatus as recited in claim 8, wherein an orthogonal projection area of the first type electrode on the driving substrate is smaller than or equal to an orthogonal projection area of the corresponding bonding pad on the driving substrate.

17. The display apparatus as recited in claim 16, wherein an orthogonal projection area of each of the plurality of micro light emitting devices on the driving substrate is smaller than or equal to an orthogonal projection area of the corresponding first type electrode on the driving substrate.

* * * * *